United States Patent
Nepomuceno et al.

(10) Patent No.: US 6,911,377 B2
(45) Date of Patent: Jun. 28, 2005

(54) WAFER CUTTING USING LASER MARKING

(75) Inventors: Lamberto V. Nepomuceno, Muntinlupa (PH); Reynaldo S. Atienza, Jr., Mesa Manila (PH); Reginald T. Taar, Quezon (PH)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/777,619

(22) Filed: Feb. 12, 2004

(65) Prior Publication Data

US 2004/0161877 A1 Aug. 19, 2004

Related U.S. Application Data

(62) Division of application No. 10/164,047, filed on Jun. 5, 2002, now Pat. No. 6,716,723.

(51) Int. Cl.[7] .......................... H01L 21/78; H01L 21/50

(52) U.S. Cl. ........................................ 438/462; 438/121

(58) Field of Search .................................. 438/462, 401, 438/800, 5, 7–9, 16; 257/797; 700/121; 716/4

(56) References Cited

U.S. PATENT DOCUMENTS 4,534,804 A * 8/1985 Cade ........................ 438/694

* cited by examiner

*Primary Examiner*—Craig A. Thompson
(74) *Attorney, Agent, or Firm*—Blakely, Sokoloff, Taylor & Zafman LLP

(57) ABSTRACT

An embodiment of the present invention includes a chuck, an imaging sensor, and a laser. The chuck holds a wafer having a front side attached to a tape. The imaging sensor obtains a scribe pattern on the front side through the tape. The laser is mounted above the chuck to mark an alignment pattern on a back side of the wafer based on the scribe pattern.

16 Claims, 8 Drawing Sheets

WAFER CUTTING USING LASER MARKING

CROSS-REFERENCES TO RELATED APPLICATIONS

This is Divisional Application of U.S. patent application Ser. No. 10/164,047, filed Jun. 5, 2002 now U.S. Pat. No. 6,716,723. This Divisional Application claims the benefit of the U.S. patent application Ser. No. 10/164,047.

BACKGROUND

1. Field

Embodiments of the invention relate to the field of semiconductor fabrication, and more specifically, to wafer processing.

2. Background

Semiconductor devices are fabricated in an array on a wafer. The semiconductor devices are typically separated by vertical and horizontal scribe lines. The wafer is processed, cut or diced, through the scribe lines to singulate the devices from one another. Traditionally, the cutting process is performed with wafer spindle and blade assemblies having cutting blades with various shapes. To hold the wafer in place while cutting, a tape is attached to the surface of the wafer.

To obtain precision in cutting, the saw blade is aligned with the scribe lines. Traditional techniques to align the saw blade use optical alignment systems. In these systems, a charge coupled devices (CCD) camera captures the etching pattern of the scribe lines. The pattern information is then transmitted to a computer having appropriate vision or pattern recognition software to control the mechanical system and assembly that position the saw blade. The cutting process is then performed on the active side or front side of the wafer. Cutting from both the front and back sides may have many undesirable effects. These include the generation of shards and particulates during sawing. In addition, the alignment may not be accurate due to sensor errors.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a chuck, an imaging sensor, and a laser. The chuck holds a wafer having a front side attached to a tape. The imaging sensor obtains a scribe pattern on the front side through the tape. The laser is mounted above the chuck to mark an alignment pattern on a back side of the wafer based on the scribe pattern.

In the following description, numerous specific details are set forth. However, it is understood that embodiments of the invention may be practiced without these specific details. In other instances, well-known circuits, structures, and techniques have not been shown in order not to obscure the understanding of this description.

Figure 1A:
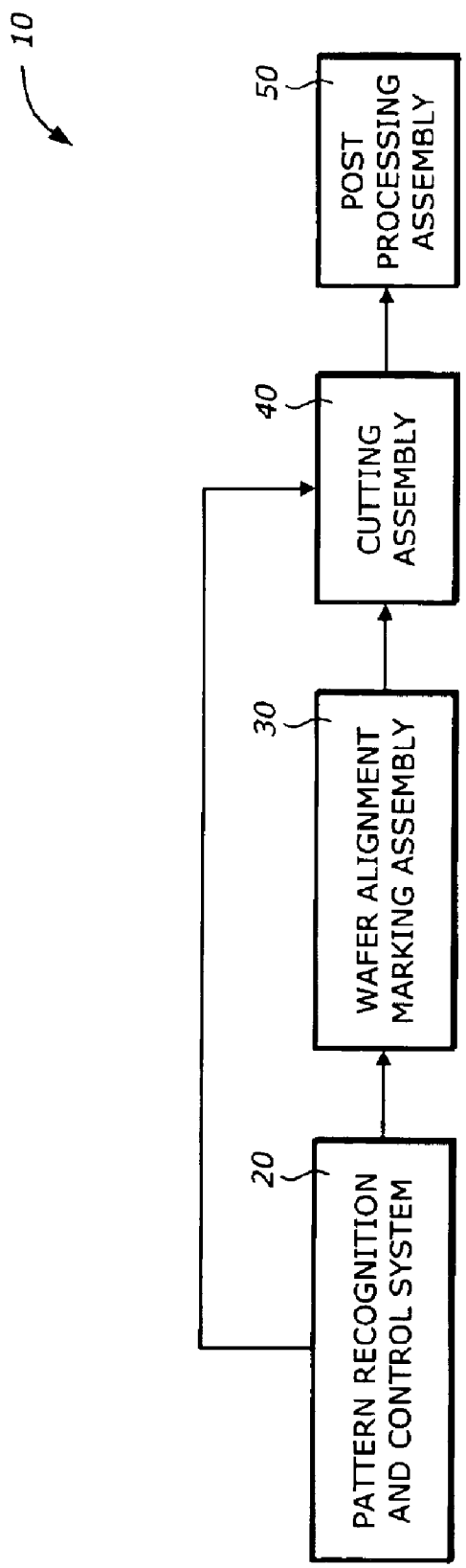
FIG. 1A is a diagram illustrating a system in which one embodiment of the invention can be practiced.

FIG. 1A is a diagram illustrating a system 10 in which one embodiment of the invention can be practiced. The system 10 includes a pattern recognition and control system (PRCS) 20, a wafer marking assembly 30, a cutting assembly 40, and a post processing assembly 50.

The PRCS 20 performs pattern recognition tasks for the marking and alignment process to prepare the wafer for cutting. The PRCS 20 interfaces with the wafer alignment marking assembly 30 and the cutting assembly 40 to receive imaging information of a scribe pattern on the wafer and to control various elements in these assemblies. The PRCS 20 may be separated or integrated with these assemblies. In one embodiment, the PRCS 20 is a computer system separated from the mechanical assembly but has interfaces to receive and transmit information and control data. The PRCS 20 is described in FIG. 1B.

The wafer alignment marking assembly 30 is a subsytem that includes a wafer and other components for marking the alignment pattern on the wafer surface for alignment. It receives control information from the PRCS 20 and sends image and pattern data to the PRCS 20. The wafer alignment marking assembly 30 is described later in FIGS. 2 and 3.

The cutting assembly 40 includes a cutter, dicer, or a saw blade to saw the wafer using the alignment pattern provided by the PRCS 20. It may also receive control data from the PRCS 20 to activate the cutter or saw blade. The cutting or sawing process is typically performed after the wafer alignment marking assembly 30 marks the alignment cutter.

The post processing assembly 50 includes subsystems or elements to perform other post cutting processes. These post processes include washing, cleaning, drying, pick-and-place, and off loading the singuated devices to trays or other transport subsystems.

Figure 1B:
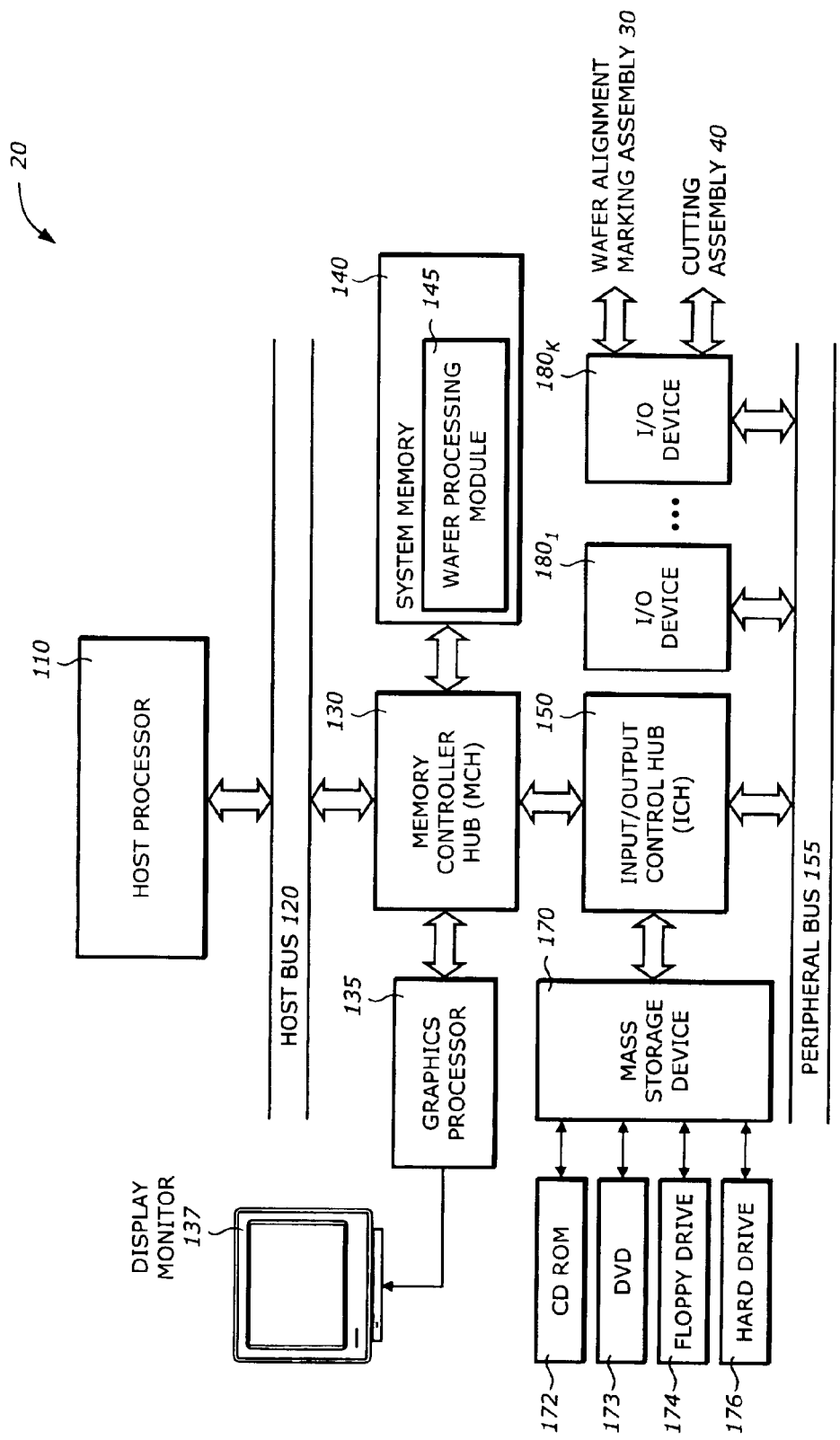
FIG. 1B is a diagram illustrating a pattern recognition and control system shown in FIG. 1A according to one embodiment of the invention.

FIG. 1B is a diagram illustrating a pattern recognition and control system 20 shown in FIG. 1A according to one embodiment of the invention. The system 20 includes a host processor 110, a host bus 120, a memory control hub (MCH) 130, a graphics processor 135, a display monitor 137, a system memory 140, an input/output control hub (ICH) 150, a peripheral bus 155, a mass storage device 170, and input/output devices $180_1$ to $180_K$. Note that the system 20 may include more or less elements than these elements.

The host processor 110 represents a central processing unit of any type of architecture, such as embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture.

The host bus 120 provides interface signals to allow the processor 110 to communicate with other processors or devices, e.g., the MCH 130. The host bus 120 may support a uni-processor or multiprocessor configuration. The host bus 120 may be parallel, sequential, pipelined, asynchronous, synchronous, or any combination thereof.

The MCH 130 provides control and configuration of memory and input/output devices such as the system memory 140 and the ICH 150. The MCH 130 may be integrated into a chipset that integrates multiple functionalities such as the host-to-peripheral bus interface and memory control. The MCH 130 interfaces to the peripheral bus 155. For clarity, not all the peripheral buses are shown. It is contemplated that the system 100 may also include peripheral buses such as Peripheral Component Interconnect (PCI), accelerated graphics port (AGP), Industry Standard Architecture (ISA) bus, and Universal Serial Bus (USB), etc.

The graphics processor 135 is any processor that provides graphics functionalities. The graphics processor 135 may also be integrated into the MCH 130 to form a Graphics and Memory Controller Hub (GMCH). The graphics processor 135 may be a graphics card such as the Graphics Performance Accelerator (AGP) card, interfaced to the MCH 130 via a graphics port such as the Accelerated Graphics Port (AGP) controller. The graphics processor 135 provides interface to the display monitor 137 such as standard progressive scan monitor, television (TV)-out device, and Transition Minimized Differential Signaling (TMDS) controller. The display monitor 137 may be any display device such as Cathode Ray Tube (CRT) monitor, TV set, Liquid Crystal Display (LCD), Flat Panel, Digital CRT, and touch screen.

The system memory 140 stores system code and data. The system memory 140 is typically implemented with dynamic random access memory (DRAM) or static random access memory (SRAM). The system memory may include program code or code segments implementing one embodiment of the invention. The system memory includes a wafer processing module 145. Any one of the elements of the wafer processing module 145 may be implemented by hardware, software, firmware, microcode, or any combination thereof. The system memory 140 may also include other programs or data which are not shown, such as an operating system.

The ICH 150 has a number of functionalities that are designed to support I/O functions. The ICH 150 may also be integrated into a chipset together or separate from the MCH 130 to perform I/O functions. The ICH 150 may include a number of interface and I/O functions such as PCI bus interface to interface to the peripheral bus 155, processor interface, interrupt controller, direct memory access (DMA) controller, power management logic, timer, system management bus (SMBus), universal serial bus (USB) interface, mass storage interface, low pin count (LPC) interface, etc.

The mass storage device 170 stores archive information such as code, programs, files, data, applications, and operating systems. The mass storage device 170 may include compact disk (CD) ROM 172, a digital video/versatile disc (DVD) 173, floppy drive 174, and hard drive 176, and any other magnetic or optic storage devices. The mass storage device 170 provides a mechanism to read machine-accessible media. The machine-accessible media may contain computer readable program code to perform tasks as described in the following.

The I/O devices $180_1$ to $180_K$ may include any I/O devices to perform I/O functions. Examples of I/O devices $180_1$ to $180_K$ include controller for input devices (e.g., keyboard, mouse, trackball, pointing device), media card (e.g., audio, video, graphics), network card, and any other peripheral controllers.

Elements of one embodiment of the invention may be implemented by hardware, firmware, software or any combination thereof. When implemented in software, the elements of an embodiment of the present invention are essentially the code segments to perform the necessary tasks. The software may include the actual code to carry out the operations described in one embodiment of the invention, or code that emulates or simulates the operations. The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information such as the mass storage devices 172. Examples of the processor readable medium include an electronic circuit, a semiconductor memory device, a read only memory (ROM), a flash memory, an erasable ROM (EROM), a floppy diskette, a compact disk (CD) ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include data that, when accessed by a machine, cause the machine to perform the operations described in the following. The term "data" here refers to any type of information that is encoded for machine-readable purposes. Therefore, it may include program, code, data, file, etc. These operations to be performed may include operations to control the image sensor, activate the flipping mechanism, recognize and/or analyze the scribe pattern, control the laser head, recognize the alignment pattern, and control the cutter assembly, as described below.

All or part of an embodiment of the invention may be implemented by software. The software may have several modules coupled to one another. A software module is coupled to another module to receive variables, parameters, arguments, pointers, etc. and/or to generate or pass results, updated variables, pointers, etc. A software module may also be a software driver or interface to interact with the operating system running on the platform. A software module may also be a hardware driver to configure, set up, initialize, send and receive data to and from a hardware device One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, etc.

Figure 2:
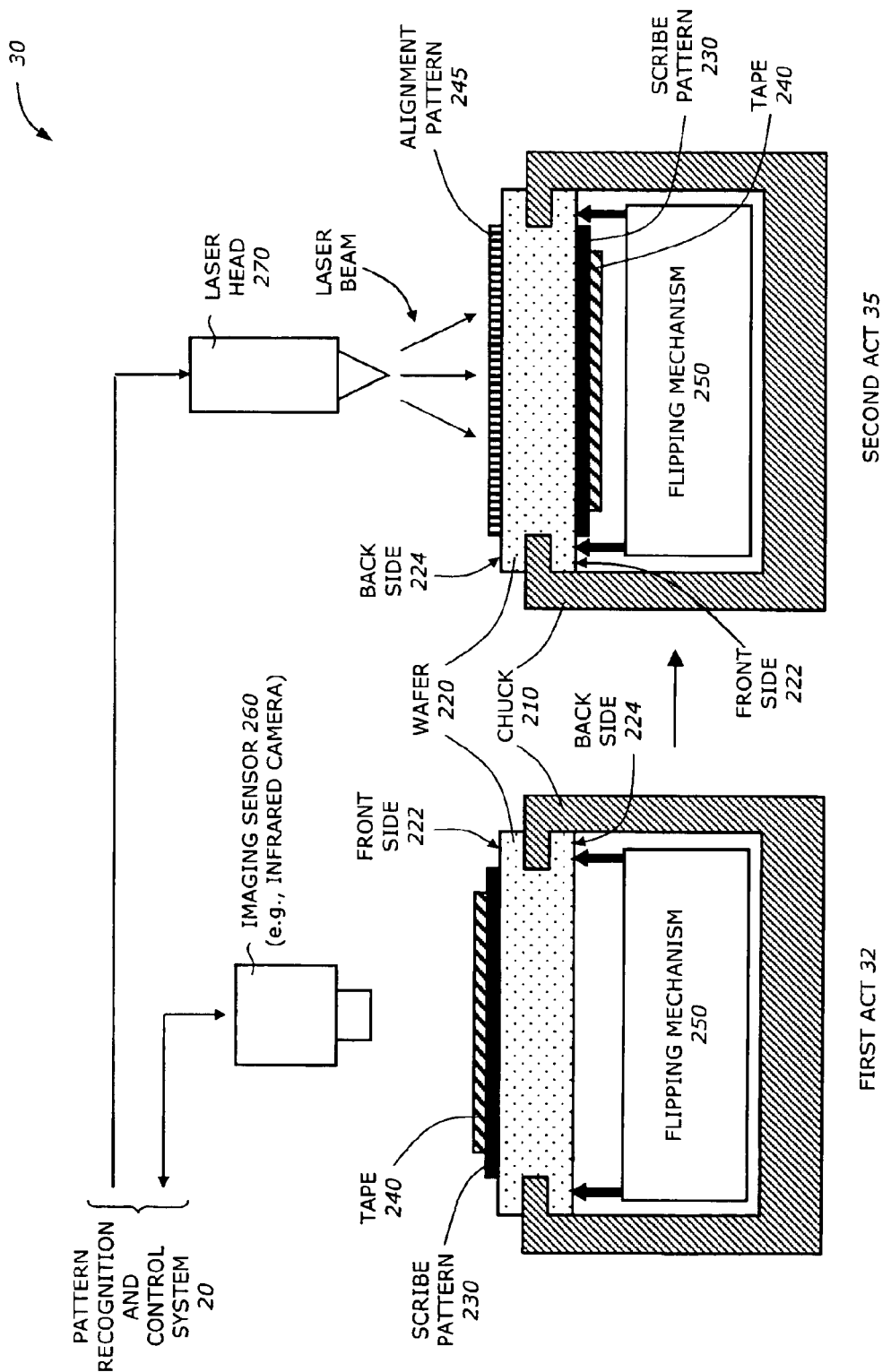
FIG. 2 is a diagram illustrating a wafer marking assembly with flipping mechanism according to one embodiment of the invention.

FIG. 2 is a diagram illustrating a wafer marking assembly 30 with flipping mechanism according to one embodiment of the invention. The wafer marking assembly includes a chuck 210, a flipping mechanism 250, an imaging sensor 260, and a laser head 270.

The chuck 210 holds a wafer 220. The wafer 220 has two surface: a front side 222 and a back side 224. The front side 222 corresponds to the active side of the wafer having an array of semiconductor devices or integrated circuits. Typically these devices or circuits are separated by horizontal and vertical scribe lines. These scribes lines form a scribe pattern 230 on the front side 222 of the wafer 220. Singulating these devices or circuits requires precisely cutting the wafer 220 through the scribe lines. To precisely cut the wafer through the scribe lines, the saw blade or cutter in the cutting assembly 40 has to be aligned precisely with the scribe line it is going to cut. The cutting of the wafer 220 may be performed at the front side 222 or at the back side 224. Cutting the wafer 220 from the front side 222 may generate shards or particulates which may cause damage to the devices or circuits. It is, therefore, desirable to cut the wafer 220 from the back side 224. To be able to cut the wafer 220 from the back side 224, it is necessary to have a pattern on the back side 224 that is directly opposite to the scribe pattern 230. This pattern is referred to as an alignment pattern 245. As will be explained later, this alignment pattern 245 is used to guide the cutter in the cutting assembly 40 to precisely cut the wafer 220 through the scribe lines in the scribe pattern 230.

The wafer 220 is held to a frame (not shown) by a tape 240. The tape 240 covers the front side 222 and the scribe pattern 230. The wafer 220 is then placed on and held by the chuck 210. Due to the presence of the tape 240 on the front side 222, imaging the scribe pattern using a regular camera such as charged coupled devices (CCD) cameras does not provide full details and may have optical errors.

The imaging sensor 260 is mounted or placed above the chuck 210 and directly above the wafer pointing down to the front side 222. The imaging sensor 260 obtains the scribe pattern 230 on the front side through the tape 240. The imaging sensor 260 is one that can capture an image of the scribe pattern 230 accurately even with the presence of the tape 240. In one embodiment, the imaging sensor 260 is an infrared camera. The imaging sensor 260 is controlled by the PRCS 20. The PRCS 20 obtains the scribe pattern 230 and analyzes the pattern using pattern recognition, image analysis, or machine vision techniques.

The flipping mechanism 250 is attached to the wafer 220 to flip the wafer 220. After being flipped, the back side 224 is faced upward. The flipping mechanism 250 may be located at any convenient location. For illustrative purposes, it is shown in FIG. 2 that it is located underneath the wafer 220 inside the chuck 210.

The laser head 270 is positioned above the wafer 220 to emit a laser beam to mark an alignment pattern 245 on the back side 224 according to the scribe pattern 230 after the wafer is flipped. The alignment pattern 245 is directly opposite to the scribe pattern 230. The laser head 270 is controlled by the PRCS 20. The marking of the alignment pattern 245 is accurate due to the precision of the laser beam and the accurate control of the PRCS 20. The PRCS 20 uses the results of the analysis of the scribe pattern 230 in order to guide and control the laser head 270 accurately. The tolerances of the laser marking may be as small as 0.001 inch (or 0.025 millimeters).

The marking of the alignment pattern 245 by the wafer alignment marking assembly 30 shown in FIG. 2 may be performed in two acts: a first act 32 and a second act 35. In the first act, the wafer 220 with the tape 240 is placed on the chuck 210 front side up. The imaging sensor 260 is positioned directly above the front side 222 to obtain the scribe pattern 230 on the front side 222. In the second act 35, the flipping mechanism 250 is activated by the PRCS 20 or any other convenient control mechanism to flip the wafer 220 so that the back side 224 is faced upward. The laser head 270 is then moved into position directly above the back side 224. The PRCS 20 controls the laser head 270 to fire or emit a laser beam to mark the alignment pattern 245 on the back side 224.

Figure 3:
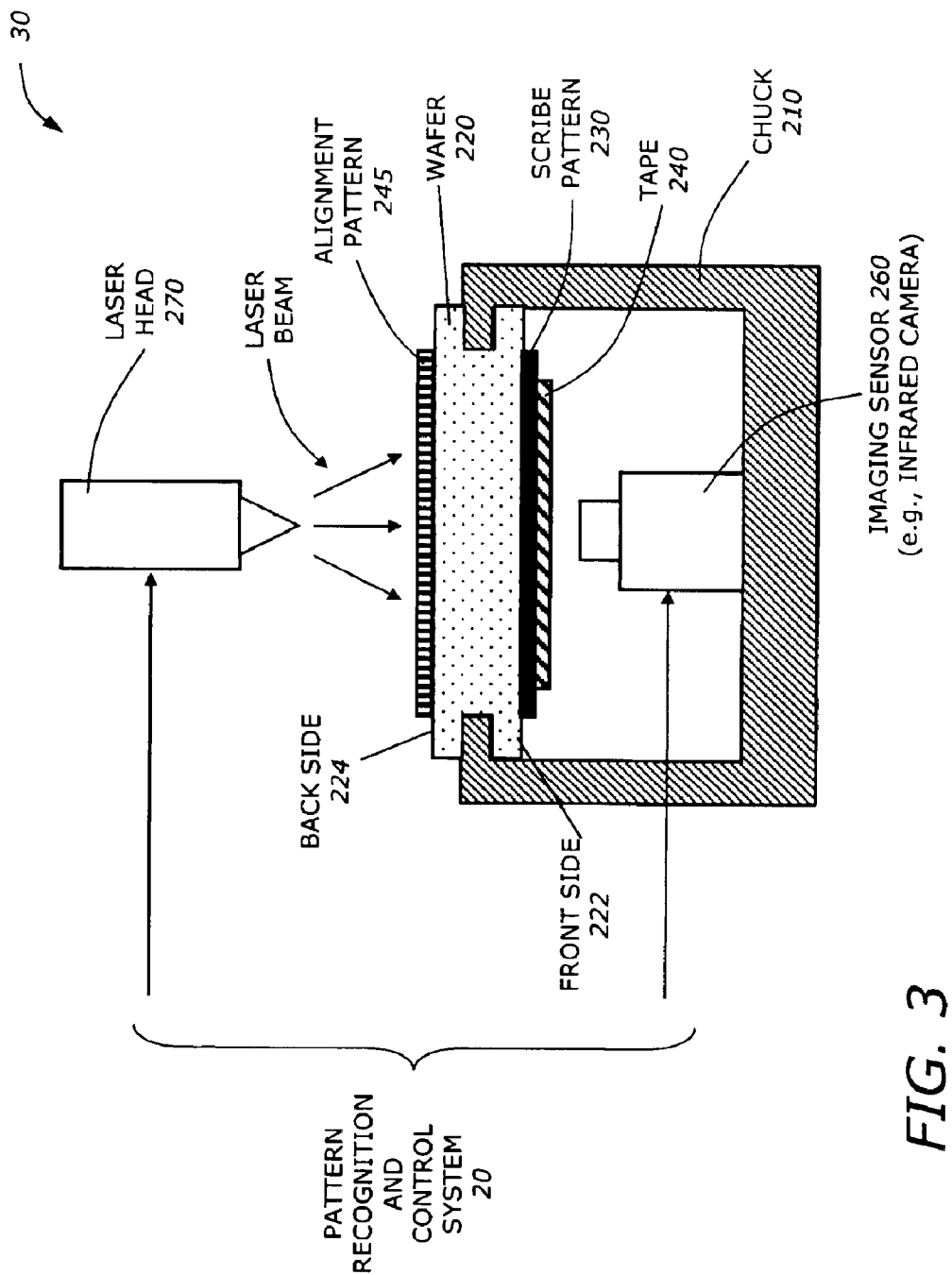
FIG. 3 is a diagram illustrating a wafer marking assembly without flipping mechanism according to one embodiment of the invention.

FIG. 3 is a diagram illustrating a wafer marking assembly 30 without flipping mechanism according to one embodiment of the invention. The wafer marking assembly 30 without the flipping mechanism includes the same elements as shown in FIG. 2 except that the flipping mechanism 250 is not needed. Instead, the wafer 220 is placed back side up on the chuck 210. The imaging sensor 260 is mounted or placed underneath the wafer 220 to obtain the scribe pattern 230 from below. The PRCS 20 obtains the scribe pattern 230 as imaged by the imaging sensor 260, analyzes the pattern as discussed above and then controls the laser head 270 to mark the alignment pattern 245 according to the scribe pattern 230.

Figure 4:
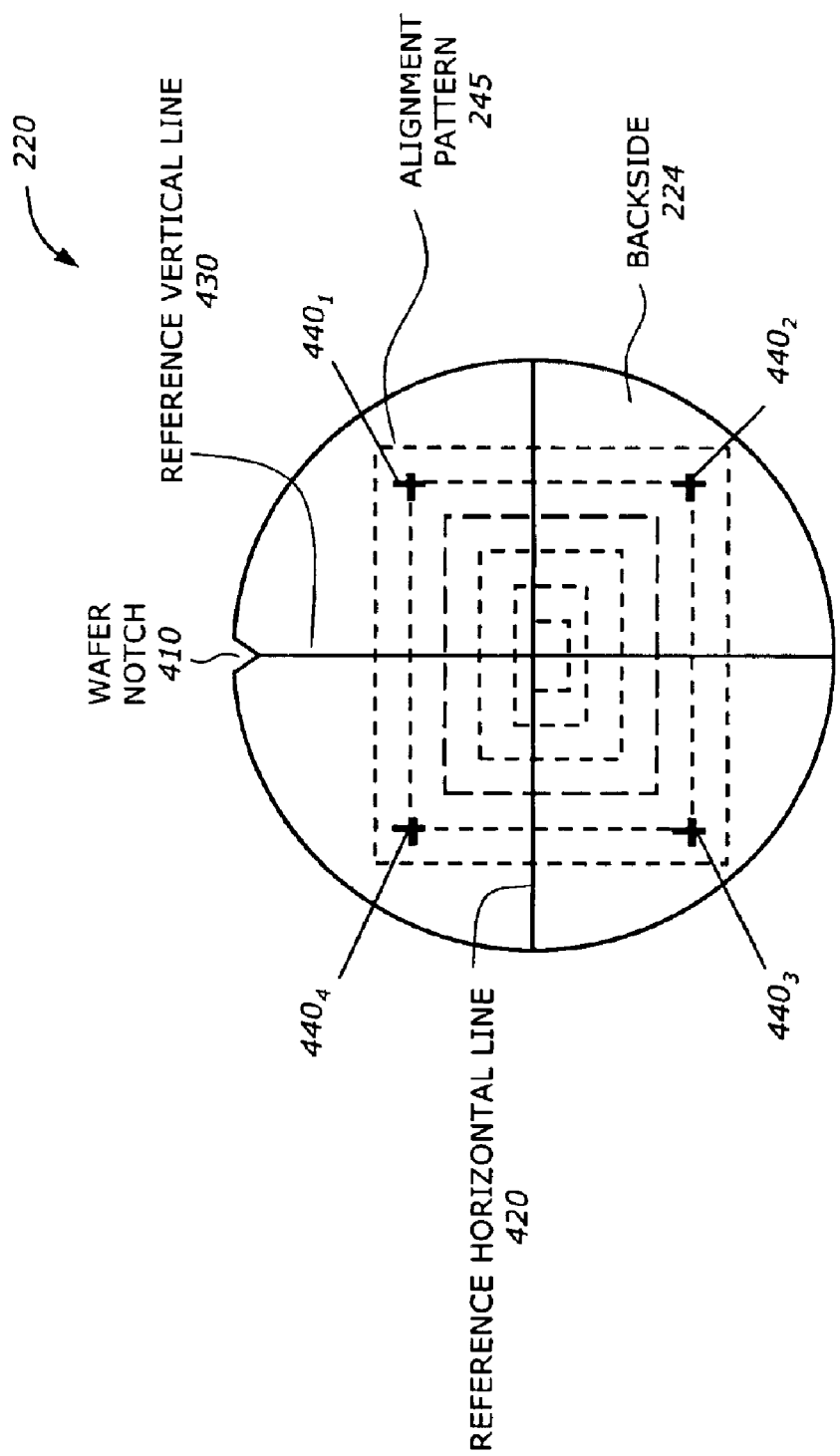
FIG. 4 is a diagram illustrating an alignment pattern according to one embodiment of the invention.

FIG. 4 is a diagram illustrating the alignment pattern 245 according to one embodiment of the invention. The alignment pattern 245 is marked on the back side 224 of the wafer 220. The wafer 220 may have a wafer notch 410 which may be used as a fiducial mark or reference point for the control of the marking.

The alignment pattern 245 corresponds exactly to the scribe pattern 230 on the front side 222. In other words, the alignment pattern 245 is directly opposite to the scribe pattern 230. It may not necessary to mark the alignment pattern 245 to fully correspond to the scribe pattern 230. Since the scribe lines in the scribe pattern 230 are horizontal or vertical straight lines, it may be sufficient to mark a reference horizontal line 420 and a reference vertical line 430, and some reference points such as $440_1$, $440_2$, $440_3$, and $440_4$. From these reference points, the cutter may be controlled to cut the wafer 220 through lines parallel to the vertical and horizontal lines 420 and 430. A prior knowledge of the geometrical properties of the scribe pattern 230 including die size, may also be employed to control the cutting precisely and efficiently.

Figure 5A:
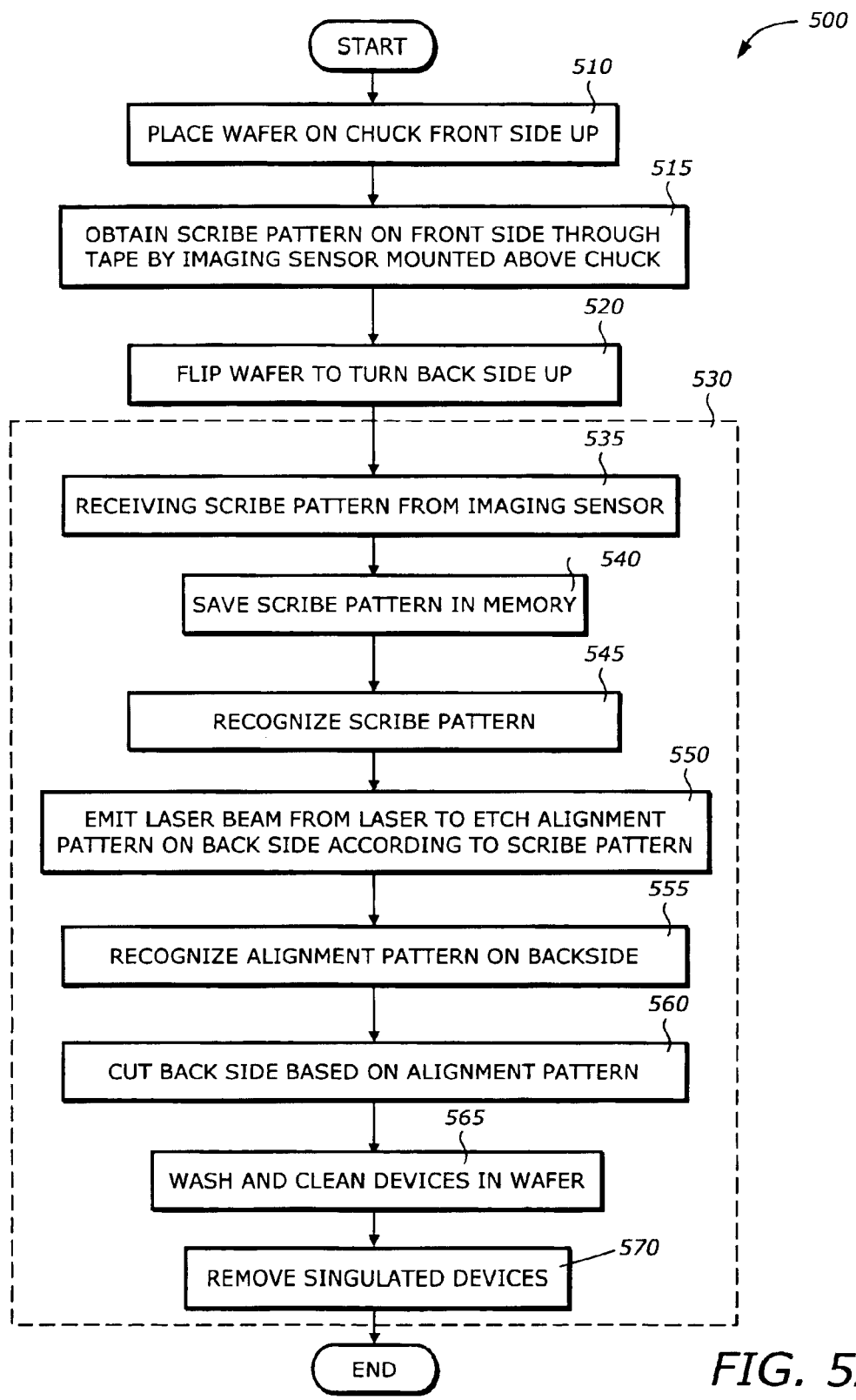
FIG. 5A is a flowchart illustrating a process to mark the wafer with flipping mechanism according to one embodiment of the invention.

FIG. 5A is a flowchart illustrating a process 500 to mark the wafer with flipping according to one embodiment of the invention.

Upon START, the process 500 places the wafer on the chuck front side up (Block 510). A tape is attached to the wafer to secure the wafer within the chuck. Next, the process 500 obtains the scribe pattern on the front side through the tape by an imaging sensor mounted above the chuck (Block 515). Then, the process 500 flips the wafer to turn the back side up (Block 520).

Next, the process 500 enters block 530 to perform marking the alignment pattern on the back side of the wafer. The process 500 receives the scribe pattern from the imaging sensor (Block 535). Then, the process 500 saves the scribe pattern in a memory (Block 540). Next, the process 500 recognizes the scribe pattern using techniques in pattern recognition, image analysis, or machine vision (Block 545). These techniques may include feature extraction, edge enhancement, line detection, line tracing, boundary follower, etc. as is known by one of ordinary skill in the art.

Then, the process 500 emits a laser beam from the laser head to etch an alignment pattern on the back side of the wafer according to the scribe pattern as recognized above (Block 550). Next, the process 500 recognizes or identifies the alignment pattern on the back side as marked by the laser (Block 555). Then, the process 500 cuts the wafer from the back side based on the alignment pattern as recognized above (Block 560).

Next, the process 500 washes and cleans the wafer or the cut devices or integrated circuits (Block 565). Then, the process 500 removes the singulated devices and transfers to a tray or an off-load container (Block 570). This removal may be performed by pick-and-place assembly. Then, the process 500 is terminated.

Figure 5B:
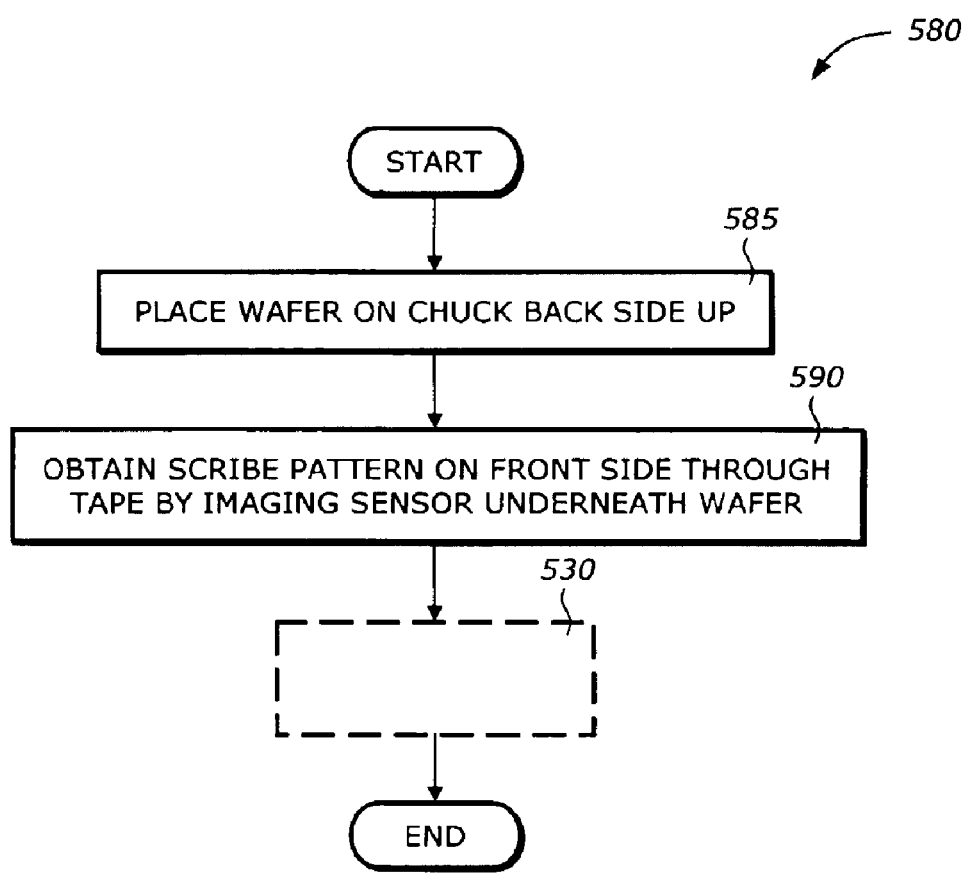
FIG. 5B is a flowchart illustrating a process to mark the wafer without flipping mechanism according to one embodiment of the invention.

FIG. 5B is a flowchart illustrating a process 580 to mark the wafer without flipping according to one embodiment of the invention.

Upon START, the process 580 places the wafer with attached tape on the chuck back side up (Block 585). Then, the process 580 obtains the scribe pattern on the front side through the tape by an imaging sensor positioned underneath the wafer (Block 590).

Next, the process 580 performs the same tasks or operations in Block 530 as described in FIG. 5A. Then, the process 580 is terminated.

Figure 6:
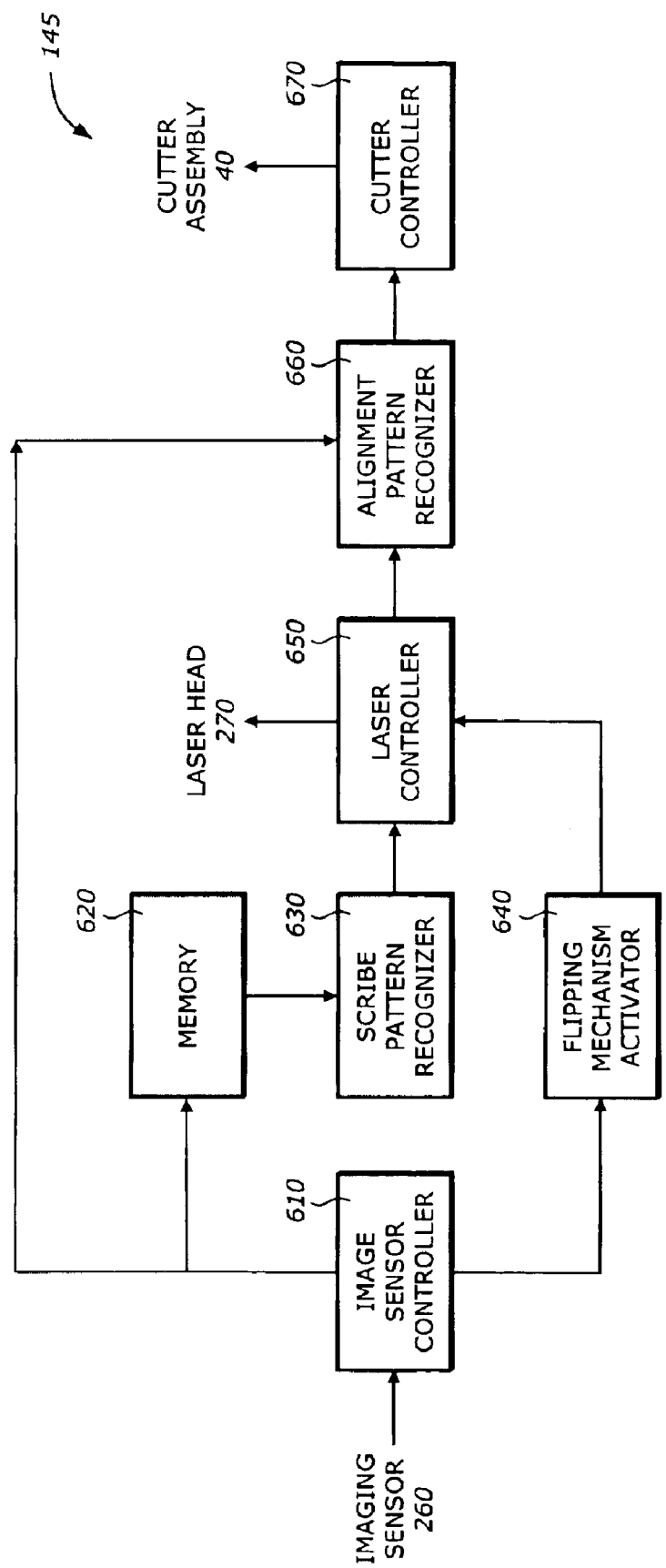
FIG. 6 is a diagram illustrating elements of a wafer processing module according to one embodiment of the invention.

FIG. 6 is a diagram illustrating elements of the wafer processing module 145 according to one embodiment of the invention. The wafer processing module 145 includes an image sensor controller 610, a memory 620, a scribe pattern recognizer 630, a flipping mechanism activator 640, a laser controller 650, an alignment pattern recognizer 660, and a cutter controller 670. The wafer processing module 145 may contain more or less than these elements. It is also contemplated that part or all of these elements may be implemented by hardware, software, firmware, electrical circuits, mechanical structures, or any combination thereof.

The image sensor controller 610 controls the image sensor 260 to obtain the scribe pattern on the front side of the wafer. The image sensor controller 610 also receives the scribe pattern as acquired, sensed, or captured by the imaging sensor. It may contain an interface to an imaging hardware such as an image capture board, a frame grabber, a digitizer, etc.

The memory 620 stores or saves the scribe pattern as obtained by the image sensor controller 610. The memory 620 may be a double-buffered memory, a RAM, a flash memory, a magnetic or optical memory.

The scribe pattern recognizer 630 analyzes and recognizes the scribe pattern retrieved from the memory 620. The scribe pattern recognizer 630 may perform this task using a suitable pattern recognition, image analysis, or machine vision technique. The analyzed scribe pattern may be represented by any convenient data structures including array, linked list, or pointers.

The flipping mechanism activator 640 activates the flipping mechanism to flip the wafer to turn the back side up. The activator 640 may be optional. It is used for the set-up as shown in FIG. 2.

The laser controller 650 receives the recognized scribe pattern represented by an appropriate data structure. It then uses the scribe pattern to control the laser head 270 to emits a laser beam to etch the alignment pattern on the back side of the wafer.

The alignment pattern recognizer 660 recognizes or identifies the alignment pattern as marked by the laser head 270 using a suitable technique as used by the scribe pattern recognizer. The alignment pattern may be captured by the image sensor 260.

The cutter controller 670 controls the cutter assembly 40 using the information from the alignment pattern recognizer 660. The cutter controller 670 moves the cutter or the saw blade according to the alignment pattern.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An article of manufacture comprising:
a machine-accessible medium including data that, when accessed by a machine, causes the machine to:
control an imaging sensor to obtain a scribe pattern on a front side of a wafer placed on a chuck, the front side being attached to a tape;
recognize the scribe pattern; and
control a laser to mark an alignment pattern on a back side of the wafer based on the scribe pattern, the laser being mounted above the chuck.

2. The article of manufacture of claim 1 wherein the data causing the machine to control the imaging sensor comprises data that, when accessed by the machine, causes the machine to:
control the imaging sensor mounted above the wafer.

3. The article of manufacture of claim 1 wherein the data causing the machine to control the imaging sensor comprises data that, when accessed by the machine, causes the machine to:
control the imaging sensor mounted underneath the wafer.

4. The article of manufacture of claim 1 wherein the data causing the machine to control the laser comprises data that, when accessed by the machine, causes the machine to:
emit a laser beam from the laser to etch the alignment pattern on the back side, the alignment pattern being directly opposite to the scribe pattern.

5. The article of manufacture of claim 1 wherein the data further comprises data that, when accessed by the machine, causes the machine to:
activate a flipping mechanism to turn the back side of the wafer up.

6. The article of manufacture of claim 1 wherein the data further comprises data that, when accessed by the machine, causes the machine to:
save the scribe pattern in a memory.

7. The article of manufacture of claim 1 wherein the data further comprises data that, when accessed by the machine, causes the machine to:
recognize the alignment pattern on the back side of the wafer.

8. The article of manufacture of claim 7 wherein the data further comprises data that, when accessed by the machine, causes the machine to:
control a cutting mechanism to cut the back side of the wafer based on the alignment pattern.

9. A method comprising:
controlling an imaging sensor to obtain a scribe pattern on a front side of a wafer placed on a chuck, the front side being attached a tape;
recognizing the scribe pattern; and
controlling a laser to mark an alignment pattern one back side of the wafer based on the scribe pattern, the laser being mounted above the chuck.

10. The method of claim 9 wherein controlling the imaging sensor comprises:
controlling the imaging sensor mounted above the wafer.

11. The method of claim 9 wherein controlling the imaging sensor comprises:

controlling the imaging sensor mounted underneath the wafer.

12. The method of claim 9 wherein controlling the laser comprises:

emitting a laser beam from the laser to etch the alignment pattern on the back side, the alignment pattern being directly opposite to the scribe pattern.

13. The method of claim 9 wherein further comprising:

activating a flipping mechanism to turn the back side of the wafer up.

14. The method of claim 9 further comprising:

saving the scribe pattern in a memory.

15. The method of claim 9 further comprising:

recognizing the alignment pattern on the back side of the wafer.

16. The method of claim 15 wherein further comprising:

controlling a cutting mechanism to cut the back side of the wafer based on the alignment pattern.

* * * * *